United States Patent [19]

Held

[11] Patent Number: 4,584,261
[45] Date of Patent: Apr. 22, 1986

[54] PROCESS FOR ETCHING NONPHOTOSENSITIVE LAYER UNDER WASHOFF PHOTOPOLYMER LAYER

[75] Inventor: Robert P. Held, Englishtown, N.J.

[73] Assignee: E. I. Du Pont de Nemours and Company, Wilmington, Del.

[21] Appl. No.: 635,346

[22] Filed: Jul. 27, 1984

[51] Int. Cl.$^4$ .......................... G03C 5/16; G03F 1/00; G03C 1/71; G03F 7/00
[52] U.S. Cl. ......................................... 430/294; 430/6; 430/273; 430/323; 430/325; 430/331; 430/300; 430/277
[58] Field of Search .................. 430/6, 294, 273, 323, 430/325, 331, 271, 300, 277

[56] References Cited

U.S. PATENT DOCUMENTS

| | | | |
|---|---|---|---|
| 3,415,698 | 12/1968 | Hellmig et al. | 430/6 X |
| 3,488,194 | 1/1970 | Lydick et al. | 96/67 |
| 4,088,084 | 2/1977 | Ikeda et al. | 96/35 |
| 4,094,679 | 6/1978 | Washizawa et al. | 430/323 |
| 4,138,262 | 2/1979 | Wacks et al. | 96/87 R |
| 4,357,416 | 11/1982 | Fan | 430/271 X |
| 4,472,494 | 9/1984 | Hallman et al. | 430/325 X |

FOREIGN PATENT DOCUMENTS 57-111532  7/1982  Japan .

Primary Examiner—John E. Kittle
Assistant Examiner—Cynthia Hamilton

[57] ABSTRACT

Process for preparation of dot-etched, photopolymerizable lithographic film which comprises (a) exposing imagewise a photopolymerizable element consisting essentially of a support and two caustic or water soluble layers, the upper layer being clear, unpigmented photopolymer and the lower layer being a polymeric binder having dispersed therein a chemically soluble pigment, e.g., colloidal silver or other metal; and optionally an overcoat layer; developing the exposed element with caustic solution and then water; and treating the developed image with a solubilizing agent, e.g., $K_2Fe(CN)_6$, $FeCl_3$, $Na_2S_2O_3$, KCNS, KOH, $NH_3$, etc. A dot-etched lithographic film is prepared.

12 Claims, 6 Drawing Figures

PROCESS FOR ETCHING NONPHOTOSENSITIVE LAYER UNDER WASHOFF POLYMER LAYER

TECHNICAL FIELD

This invention relates to a process for the preparation of a dot-etched lithographic film. More particularly this invention relates to a process for the preparation of a dot-etched lithographic film having two caustic or water soluble layers, the lower layer being nonphotosensitive and having chemically soluble pigment dispersed therein.

BACKGROUND ART

In the photomechanical trades, a mask containing an image that is opaque to actinic radiation is used in preparing a printing plate of some kind, e.g., letterpress, lithographic, etc. The mask is used as a phototool in exposing a layer of photosensitive resist-forming material present on a metal or plastic plate or a photopolymer printing plate matrix. After the exposure the printing plate is formed by etching or liquid development depending on the system present. The image in the mask must be of the highest possible contrast, e.g., completely opaque black in the image areas, and completely transparent (free from fog) in the unexposed areas. Silver halide film known as "litho" film is used to prepare the mask. When a litho film is exposed through a halftone screen and developed, it contains an image comprised of dots. The dots correspond to the areas of the film under the transparent areas of the halftone screen and are comprised of exposed and developed material. In silver halide litho film, these dots may be reduced in size by a process referred to as "dot-etching", i.e., reducing the size of, or "etching" the halftone dots, thereby changing the tone values of the image. In silver halide films dot-etching is accomplished chemically by treating the films with a silver "solvent". Silver halide films are expensive and require special red light handling.

Bratt and Cohen in U.S. Pat. No. 4,173,673 claim a dot-etchable mask prepared by imagewise exposure of a photopolymerizable element which comprises a support bearing a photopolymerizable layer having an optical density in the actinic region of at least 3.0 and having a thickness no greater than 0.015 mm. A removable cover sheet or a soluble overcoat layer can be present on the photopolymerizable layer. After the exposure through a halftone screen, the polymerized dots have a hardened upper skin which rests on softer undervolume having a lesser degree of polymerization or hardening. The dots are reducible in size by undercutting the polymeric dots with a solvent for the softer undervolume and removing hardened polymer from the edges of the hardened upper skins by mechanical action on the image bearing surface of the mask. The dot-etching of photopolymerizable element as described above requires the proper balance of the imagewise exposure and the undercutting of the polymeric dots with a solvent and mechanical action on the image bearing surface of the mask.

It is therefore desirable to provide a process whereby a dot-etched photopolymerizable lithographic film is prepared which does not require solvent undercutting of the polymerized image or dots as well as the use of mechanical action on the image or dots.

BRIEF DESCRIPTION OF THE DRAWING

In the accompanying drawing forming a material part of this disclosure.

DISCLOSURE OF THE INVENTION

In accordance with this invention, there is provided a process for the preparation of a dot-etched photopolymerizable lithographic film which comprises
(a) exposing imagewise to actinic radiation a photopolymerizable element consisting essentially of a support bearing, in order,
 (1) a nonphotosensitive layer of a caustic or water soluble polymeric binder having dispersed therein a chemically soluble pigment, and
 (2) a layer of clear, unpigmented caustic or water soluble photopolymerizable composition comprising a caustic soluble binder, and, optionally,
 (3) a clear, aqueous soluble, overcoat layer;
(b) developing the exposed element with a caustic solution and then with water;
(c) treating the developed image with a solubilizing agent for the pigment whereby the size of the pigmented area is reduced by diffusion etching of the image without affecting the optical density of the image.

The invention is based on the discovery of the process of reducing exposed and developed areas (especially halftone dots) of a photopolymerizable element and that photopolymerizable elements usable in the process can be obtained using two supported superimposed caustic or water soluble layers, the lower layer being nonphotosensitive and having chemically soluble pigment dispersed therein, and the upper layer being clear, unpigmented photopolymerizable composition. The caustic or water soluble layers are thin, the lower nonphotosensitive layer ranging in thickness from 0.0001 to 0.001 inch (0.0025 to 0.025 mm) and the upper photopolymerizable layer ranging in thickness from 0.0001 to 0.001 inch (0.0025 to 0.025 mm). Imagewise exposure to actinic radiation, e.g., in the region 320 to 450 nm, produces hardened areas or dots in the upper photopolymerizable layer corresponding to the transparent areas of the stencil, mask or process transparency through which the element is exposed.

While compositions prepared according to the present invention can be processed by hand by washing and rinsing with water and caustic solutions, a preferred method is to pass them through an automatic processing machine where the temperature and spray pattern of the processing solutions can be regulated. Also within a machine the speed of advance can be regulated so that a thicker film can be passed through at a slower rate in order to allow a larger amount of polymer to be adequately removed. A first section of such a machine can spray a film to wash off a water soluble protective overcoat. A second section can spray a film with a mild caustic solution to solubilize polymer in the unexposed areas of the film. A third section can spray the film to remove the solubilized polymer and produce an image using either hot or cold water.

Figure 1A:
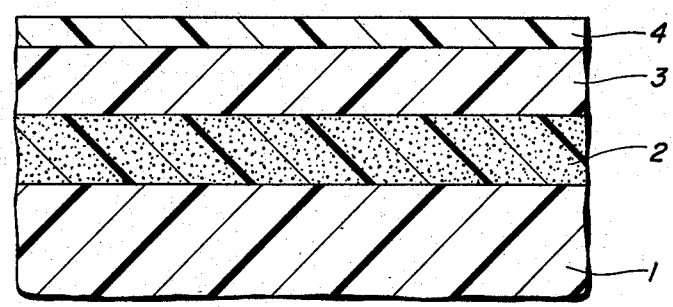
FIG. 1A is a cross-section of a photopolymerizable element useful in the process of this invention.
Figure 1B:
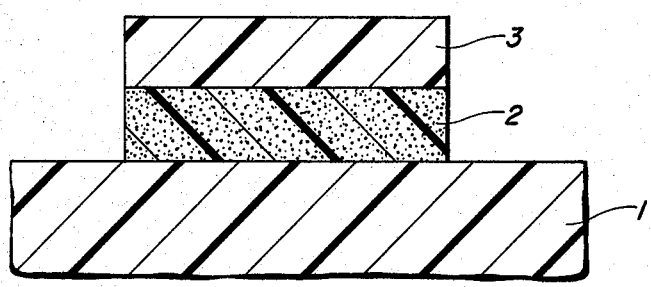
FIG. 1B is a cross-section of the photopolymerizable element of FIG. 1A after imagewise exposure and liquid development in hot water.
Figure 2A:
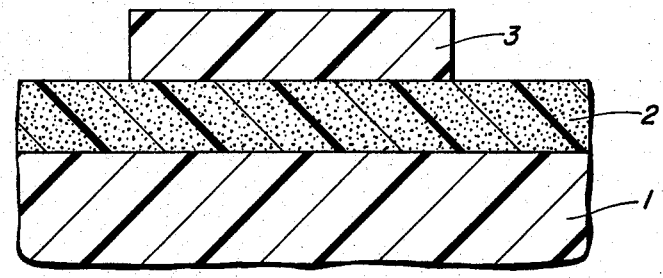
FIG. 2A is a cross-section of the photopolymerizable element of FIG. 1A after imagewise exposure and liquid development in cold water.

Development of the elements after exposure requires at least two development steps, three, if an initial water wash is used. An optional but preferred clear, aqueous soluble overcoat layer is present as the outer layer of the element. The unexposed areas of photopolymerizable layer are removed by treatment with a relatively dilute caustic solution which solubilizes the unexposed areas of the element followed by a treatment with hot water, e.g., about to 38° to 48° C., preferably about 42° C. which removes the solubilized unexposed areas and dissolves the binder in the lower nonphotosensitive layer thereby removing the colloidal silver containing layer from the support. This procedure is illustrated in FIG. 1B. If, however, the hot water treatment is replaced by a cold water treatment, e.g., below 25° C., the colloidal silver containing layer remains unaffected although the unexposed areas of the photopolymerizable layer are removed. This procedure is illustrated in FIG. 2A. The pigment in the nonphotosensitive layer beneath the areas of the removed upper layer are then bleached and fixed to produce a polymerized area or dot under the exposed photopolymer. The developed elements of FIGS. 1B and 2B containing polymerized areas or dots are then treated with a solubilizing agent for the pigment dispersed therein. By means of diffusion etching of the polymerized image, the size of the pigmented image is reduced without substantially removing the polymerized hardened area or dot, i.e., without substantially affecting the thickness of the photopolymer layer.

The photopolymerizable element useful in the inventive process consists essentially of a support bearing two dry caustic or water soluble layers. The upper layer is a clear photopolymerizable layer which is unpigmented. The lower layer is nonphotosensitive and comprises a caustic or water soluble polymeric binder having dispersed therein a chemically soluble pigment. Sufficient pigment is present in the lower layer to provide an optical density in the actinic region of at least 2.5. Optionally, but preferably, a thin layer, e.g., 0.00003 to 0.0003 inch (0.0008 to 0.008 mm) in thickness of an aqueous soluble overcoat layer is present on the upper layer of the element.

The caustic soluble photopolymerizable composition used to form the dry photopolymerizable layer is prepared from (a) 3 to 97 parts by weight of at least one ethylenically unsaturated compound having at least one terminal ethylenic group, preferably at least two such terminal ethylenic groups;

(b) 97 to 3 parts by weight of a polymeric binder soluble in caustic solution; and (c) 0.1 to 10 parts by weight of a free radical generating addition polymerization photoinitiator or initiator system wherein two or more compounds make up the initiator system.

Other components can be present in the photopolymerization composition as is known to those skilled in the art, e.g., polymerization inhibitor, plasticizer, antihalation compounds, optical brightening agents, etc.

Suitable monomers useful in the photopolymerizable compositions include those described in U.S. Pat. Nos. 2,760,863; 2,791,504; 2,927,022; 3,261,686 and 3,380,831.

Monomers which can be used as the sole monomer or in combination with others include: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, trimethylol propane ethoxylate triacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

Polymeric organic binders that are soluble in caustic solution (solely aqueous alkaline solvent devoid of organic solvents) are vinyl addition polymers containing free carboxylic acid groups which are prepared from 30 to 94 mole percent of one or more alkyl acrylates and 70 to 6 mole percent of one or more alpha-beta-ethylenically unsaturated carboxylic acid. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German Application OS No. 2,320,849, published Nov. 8, 1973. Other useful binders are of the amphoteric type which are interpolymers comprising a basic component, an acidic component and an acrylic or methacrylic component. Preferred amphoteric interpolymers are those containing from about 30-60% of the N-substituted acrylamide or methacrylamide, from 10-20% of an acidic comonomer and up to 55% of at least one copolymerizable comonomer; e.g., 35-45% N-t-octyl acrylamide, 12-18% acrylic or methacrylic acid, 32-38% methylmethacrylate, 2-10% hydroxypropyl acrylate, and 2-10% alkyl ($C_1$-$C_4$) amino alkyl ($C_2$-$C_1$) acrylate or methacrylate. Preparation of acrylic interpolymers is described in U.S. Pat. No. 3,927,199. Use of such amphoteric interpolymers is described in U.S. Pat. No. 4,293,635 for a photopolymer composition. Acidic binders can also be obtained by selecting a preformed, compatible macromolecular polymeric binding agent which is a copolymer of (1) a styrene-type of a vinyl monomer and (2) an unsaturated carboxyl-containing monomer, as described in British Pat. No. 1,361,298.

Suitable photoinitiators or initiator systems include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoinitiators and photoinhibitors are sensitizers disclosed in Dueber U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in Pazos U.S. Pat. No. 4,168,982.

In addition to the binder, monomer and initiator, the photopolymer composition may contain other additives such as known plasticizers, dyes, pigments, optical brightening agents, adhesives aids, fillers, antihalation compounds, etc.

The caustic or water soluble nonphotosensitive composition used to form the lower dry layer of the element comprises at least one polymeric organic binder such as gelatin, gum arabic polyvinyl alcohol, polyvinyl pyrrolidone, or similar synthetic polymer. Other components which can be present in nonphotosensitive layer are surfactants dispersants, etc.

Dispersed in the bottom nonphotosensitive layer during the preparation of the nonphotosensitive composition, e.g., as shown in the examples below or as known to those skilled in the art, are chemically soluble pigments to provide an optical density in the actinic region of at least 2.5. Suitable chemically soluble pigments include: colloidal silver, copper, iron, aluminum, nickel, iron oxide, copper oxide, brass, bronze, zinc oxide, in a size range 0.01 to 10 $\mu$m. Based on the weight of the dry nonphotosensitive layer, the chemically soluble pigment can be present in a range of 25 to 75% by weight, preferably 35 to 55% by weight.

The photopolymerizable layer and nonphotosensitive layer are present or adhered on films composed of high polymers which are cast as films from molten polymer, such as polyamides, e.g., polyhexamethylene sebacamide, polyhexamethylene adipamide, polyolefins, e.g., polypropylene, polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088 and Alles, U.S. Pat. No. 2,779,684, with or without the surface coating described in the former patent. The support may have a resin "sub" or other layer thereon which may or may not be soluble and which for purposes of this invention is considered part of the support. However, the total thickness of the two layers and any soluble sub or underlayer should not exceed 0.003 inch (0.075 mm). By "soluble" is meant solubility in a solvent in which the photopolymerizable layer is developable. Preferred soluble sub layers have a thickness not exceeding about 0.0002 inch (0.005 mm). Where the particular application does not require that the base support be transparent, the dual layers may usefully be present on an opaque support, such as paper, especially water-proof photographic paper; thin metal sheets, especially aluminum and copper sheets, cardboard and the like.

The optional, but preferred, overcoat layer present on the photopolymerizable layer is an aqueous soluble layer. Preferably the overcoat is soluble in the caustic solution in which the photopolymerizable layer is soluble. The overcoat layer can be soluble in water alone. Suitable overcoat layers are described in Alles U.S. Pat. No. 3,458,311, e.g., polyvinyl alcohol and its partial esters, ethers and acetals that contain a substantial amount of unsubstituted vinyl alcohol units so that they have the requisite solubility in water. Suitable polymers include 88% to 99% hydrolyzed polyvinyl acetate. Other useful polymers include gelatin, gum arabic, methyl vinyl ether/maleic anhydride copolymers, polyvinyl pyrrolidones, and mixtures of these polymers, or other similar synthetic polymers.

The photopolymerizable element as described above is imagewise exposed, e.g., for 5 seconds to 5 minutes, through a suitable phototool, mask or transparency, e.g., a halftone dot image, to a source of actinic radiation which polymerizes the photopolymerizable layer in the areas beneath the clear image areas. The actinic radiation sources must transmit radiation in the actinic region that the free radical producing initiator is sensitive. Suitable sources include those rich in ultraviolet radiation, e.g., those disclosed in Plambeck, U.S. Pat. No. 2,760,863, Chu and Cohen, U.S. Pat. No. 3,649,268, Peiffer U.S. Pat. No. 4,157,407 and Haney and Lott, U.S. Pat. No. 4,411,980, the disclosures of which are incorporated by reference.

The imagewise exposed photopolymerized element is developed by treating the element (after removal of the overcoat layer, if present, with water) with a caustic solution normally for 0.125 to 5 minutes to solubilize the photopolymerizable layer in the areas that were not exposed. The element can be placed in the caustic solution or the caustic solution can be applied by spraying onto the surface or by other known means. Suitable caustic solutions include 5% by weight sodium carbonate/sodium bicarbonate buffer solution, hydroxides, acetates and ammonia. The caustic solution can be heated, e.g., 25° to 40° C., but this is not necessary.

The treatment with caustic is followed by a water treatment, e.g., hot water (38° to 48° C.) or cold water (below 25° C.) preferably with mild mechanical action, e.g., by spraying, brushing or rubbing the treated surface of the element. The hot water treatment removes the solubilized unexposed areas of the upper photopolymerizable layer and dissolves the binder in the lower nonphotosensitive layer beneath the removed areas of the upper layer thereby removing the chemically soluble pigment in these areas. The cold water treatment, while removing the solubilized areas of the upper photopolymerizable layer, does not affect the nonphotosensitive layer below the areas of the photopolymer layer that have been removed. In order to form a polymerized area or dot in the imagewise exposed element, it is necessary to remove or neutralize the color of the chemically soluble pigment present in the other areas of the element. In the case in which the pigment is colloidal silver it is possible to use techniques well known in the art of photography to remove silver from the lower layer. The silver metal is oxidized to silver ion and complexed so that it can be removed in solution. Potassium ferricyanide is the oxidizing or bleaching agent and sodium thiosulfate is the complexing or fixing agent. It is also possible that changes in solubility with change in oxidation state can similarly be employed with other pigments to remove them as required. Iron, copper and nickel pigments can change oxidation state and solubility in a manner similar to silver via selection of the correct chemical environment, i.e., oxidant and chelating agent.

The developed element is then treated with one or more solubilizing agents for the pigment which does not substantially affect either the photopolymerized layer or the nonphotosensitive layer but by diffusion into the pigmented layer etches away the pigment whereby the size of the pigmented images or dots is reduced without substantial decrease in optical density. The particular pigment dispersed in the photopolymerizable layer determines the type of solubilizing agent that may be used. Suitable solubilizing agents for iron compounds include hydrochloric acid, oxalic acid, ethylenediaminetetraacetic acid, etc. Suitable solubilizing agents for silver include dichromate salts, ferricyanide salts, ferric chloride, etc. A suitable basic solubilizing agent for aluminum is hydroxide, whereas copper containing pigments can be solubilized with ammonia. Zinc salts can be solubilized with thiosulfate or thiocyanide. The pigment may be solubilized by the formation of a complex or chelate to perform the etching process. Specific solubilizing agents are taken from the group consisting of $K_2Fe(CN)_6$, $FeCl_3$, $Na_2S_2O_3$, KCNS, KOH, $NH_3$, oxalic acid, and ethylenediaminetetraacetic acid, and mixtures thereof. The developed element can be placed in the solubilizing agent or the solubilizing agent can be applied by brushing, spraying, etc. localized areas. The period of treatment with the solubilizing agent depends on various factors including the agent used, the dispersed pigment present and the desired amount of reduction of the image or dot. A preferred embodiment is described in Example 1 below.

INDUSTRIAL APPLICABILITY

The dot-etched photopolymer lithographic film prepared by the inventive process is useful in lithographic plate making, wherein a mask of the invention is one of a plurality of color separation masks. The size of the exposed areas (dots) is carried out to an extent whereby a composite color image produced with the masks (on a lithographic plate or on a proofing film) has the same tonal balance as the original color image. The elements prepared by the inventive process are capable of functioning in the aforementioned process, thereby providing a new and improved replacement for silver halide litho masks.

In use, a printer desiring to prepare full color prints of a process transparency would expose the yellow photomask of this invention to a halftone image of the yellow component of the process transparency, the magenta photomask to the magenta component, the cyan photomask to the cyan component, and, usually, a black photomask to the gray-to-black component. After exposure and development, the imaged masks would be assembled, one on top of the other in register, to yield a full color proof of the original, e.g., when viewed with transmitted light. If the color reproduction was satisfactory, each imaged photomask would be used for exposing a positive-working photosensitive printing plate, which then processed and inked with an ink corresponding in color to the color of the photomask, would yield prints of that color. Multiple printing from plates exposed through each of the yellow, magenta, cyan, and black imaged masks, and inked accordingly, would yield a faithfully reproduced full-color print of the original process transparency.

At other times, when the color-coded above described imaged photomasks have been assembled for proofing, it may be observed that the full color proof is, for example, too yellow, or too red, etc., either overall or in certain regions. In this instance, the imaged photomask corresponding to the excess color would be corrected by dot-etching, either overall or locally. After dot-etching, the imaged photomasks would be reassembled and inspected again. Further corrections may be necessary, and they would be made until the assembled masks gave the full-color reproduction desired. When satisfactory, each mask would then be used to expose a photosensitive printing plate.

EXAMPLES

The following examples illustrate the invention wherein the percentages are by weight. The molecular weights of polymeric compounds are weight average molecular weights (Mw). The Mw of the polymers can be determined by using a light scattering technique using known standard samples, e.g., polystyrene, polymethacrylic acid, polymethylmethacrylate, etc., as known to those skilled in the art.

EXAMPLE 1

A colloidal silver in gelatin composition was prepared as follows:

Solution I

Limed bone gelatin: 96 g
Water (cold): 1680 g

The gelatin was slowly added to the cold water and stirred for 15 minutes to allow the gelatin to swell. The gelatin was then dissolved by raising the temperature to 40° C. and holding for 15 minutes.

NaOH 3N solution: 7 ml

The caustic was added to obtain a pH of 9.0.

Solution II

A 14.5 g portion of strontium nitrate was dissolved in 132 ml water. Then 150 ml of 3N silver nitrate solution was added at 40° C.

Solution II was added to Solution I with stirring at 40° C. After holding for 15 minutes at 40° C. Solution III below was added in 60 seconds.

Solution III

Water: 330.0 ml
Sodium Sulfite (anhydrous): 62.5 g
Hydroquinone: 12.75 g

The combination of the three solutions was heated to 40° C. and stirred until dissolved.

After the addition of Solution III to the combination of I and II the colloidal silver was digested at 40° C. for 30 minutes. A blue-black colloidal silver suspension was produced which was 11.2% solids and had a pH of 5.2.

A layer of the gelatin/colloidal silver was coated on a polyethylene terephthalate support (layer 1 of FIG. 1A) to give a coating weight of about 0.7 g/m² of silver. The dried layer (layer 2 of FIG. 1A) was then overcoated with a clear photopolymer composition prepared as follows:

Methylmethacrylate/ethylmethacrylate/acrylic acid terpolymer, Acid No. 100, Mw 200,000, Tg 70° C., Carboset®526, B. F. Goodrich, Akron, Ohio: 3.4%
Amphoteric Interpolymer formed from 40% N-t-octyl acrylamide, 34% methyl methacrylate, 16% acrylic acid, 6% hydroxy propyl methacrylate and 4% t-butyl ammino ethyl methacrylate Mw ca. 50,000: 59.0%
Triethylene glycol dimethacrylate: 14.7%
Trimethylol propane triacrylate: 14.7%
Benzophenone: 8.1%
Michler's ketone: 0.8%
2,2'-bis(o-chlorophenyl)-4,4',5,5'-tetraphenyl-biimidazole: 3.4%
Leuco Crystal Violet Basic Violet 3 (C.I. No. 42555): 0.8%
Victoria Green Dye (C.I. No. 18): 0.05%

The above composition was dissolved in 90/10 methylene chloride/methanol and coated over the gelatin/colloidal silver. When dry the clear photopolymer layer (layer 3 of FIG. 1A) was overcoated with a polyvinyl alcohol oxygen barrier layer which was dried (layer 4 of FIG. 1A).

The photopolymer element was imagewise exposed through a target with a Pulsed Xenon Arc at 4 kw for 20 seconds at a distance of 46 cm. The exposed element was processed through a Crona-Lite ® Model II Processor, manufactured by E. I. du Pont de Nemours and Company, Wilmington, DE at 160 inches/minute (406.4 cm/minute) in which the surface was sprayed in three steps: (1) cold water removed the water soluble polyvinyl alcohol (layer 4 of FIG. 1A); (2) 5% sodium carbonate sodium bicarbonate buffer solution solubilized the unexposed areas, (3) hot water (38° C.) removed the solubilized polymer and dissolved the gelatin to remove the underlaying colloidal silver layer (see FIG. 1B).

Figure 1C:
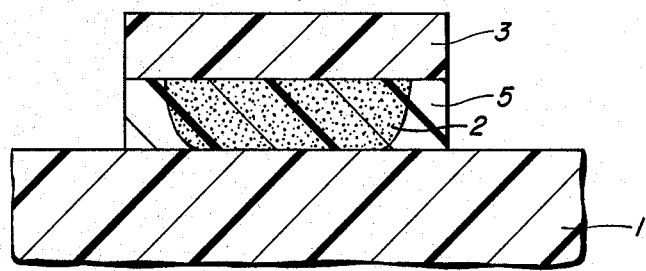
FIG. 1C is a cross-section of the element of FIG. 1B after being dot-etched according to the invention.

The colloidal silver was then dot-etched with a 15% $K_2Fe(CN)_6$ solution or alternatively with a 42 Baumé ferric chloride etchant solution. The silver was observed to dissolve from the edges without decrease in dot density leaving the gelatin in the layer unchanged (5 of FIG. 1C). The dot-etched element is illustrated in FIG. 1C.

EXAMPLE 2

The element described in Example 1 was exposed and processed except that the final spray (3) in the processor was cold water (20° C.) (See FIG. 2A). As a result the colloidal silver was not removed beneath unexposed areas where the solubilized polymer was washed away (2 of FIG. 2A).

Figure 2B:
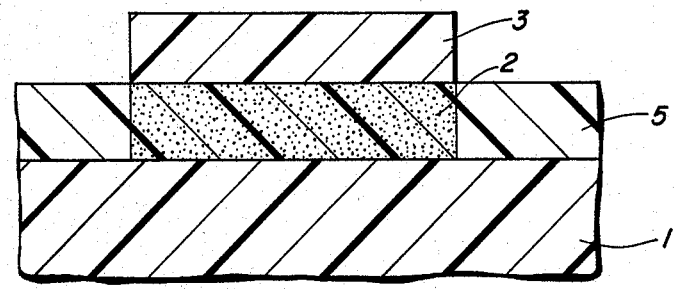
FIG. 2B is a cross-section of the element of FIG. 2A after being bleached and fixed.
Figure 2C:
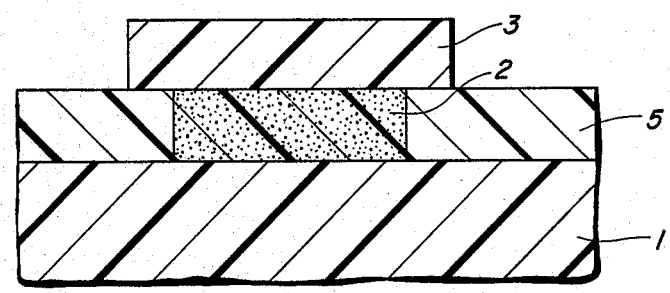
FIG. 2C is a cross-section of the element of FIG. 2B after being dot-etched according to the invention.

With the hardened photopolymer acting as a relief mask the exposed silver was bleached with a water solution of potassium ferricyanide and then fixed with an acidic solution of sodium thiosulfate to produce clear areas and produce a dot pattern (5 of FIG. 2B) under the exposed photopolymer (See FIG. 2B). The dots were then dot-etched as described in Example 1 to provide a much sharper dot image than by the hot water process of Example 1 (See FIG. 2C).

EXAMPLE 3

A dispersion of copper powder in polyvinyl alcohol was prepared as follows:

Vinol®107 Polyvinyl alcohol solution (13% solution), Air Products Corp., Allentown, PA: 77.0 g
Polystabil V 6596 (VZ) from Stockhausen, anionic polyelectrolyte dispersant distributed by Mobay Chemicals, Pittsburgh, PA: 0.5 g
Copper Powder C112, 5 μm size U.S. Bronze, Flemington, NJ: 35.0 g
Distilled Water: 12.0 g The mixture was ball milled in a jar mill for 48 hours. A layer of the polyvinyl alcohol/copper was coated on a polyethylene terephthalate support and the layer was dried. The dry layer was overcoated with the photopolymer composition of Example 1. When dry the clear photopolymer layer was overcoated with polyvinyl alcohol oxygen barrier layer as described in Example 1.

The photopolymer element was imagewise exposed through a target with a Pulsed Xenon Arc at 4 kw for 60 seconds at a distance of 46 cm. The film was processed as described in Example 1.

The fine copper powder was then dot-etched with a 42 Baumé ferric chloride etchant solution. After 30 seconds the copper was observed to begin dissolving leaving behind polymer only. The dot-etched element appeared as in FIG. 1C.

I claim:

1. A process for the preparation of a dot-etched photopolymerizable lithographic film which comprises
    (a) exposing imagewise to actinic radiation a photopolymerizable element consisting essentially of a support bearing, in order,
        (1) a nonphotosensitive layer of a caustic or water soluble polymeric binder having dispersed therein a chemically soluble pigment, and
        (2) a layer of clear, unpigmented caustic or was soluble photopolymerizable composition comprising a caustic soluble binder;
    (b) developing the exposed element with a caustic solution and then with water;
    (c) treating the developed image with a solubilizing agent for the pigment whereby the size of the pigmented area is reduced by diffusion etching of the image without affecting the optical density of the image.

2. A process according to claim 1 wherein the polymeric binder present in layers 1 and 2 are different.

3. A process according to claim 1 wherein the chemically soluble pigment is colloidal silver.

4. A process according to claim 1 wherein the chemically soluble pigment is copper powder.

5. A process according to claim 1 wherein the photopolymerizable element is overcoated with an aqueous soluble layer.

6. A process according to claim 5 wherein the aqueous soluble layer is polyvinyl alcohol.

7. A process according to claim 5 wherein prior to developing the exposed element with caustic solution the element is developed with water to remove the aqueous soluble layer.

8. A process according to claim 1 wherein the solubilizing agent is taken from the group consisting of $K_2Fe(CN)_6$, $FeCl_3$, $Na_2S_2O_3$, KCNS, KOH, $NH_3$, oxalic acid, ethylenediaminetetraacetic acid, and mixtures thereof.

9. A process according to claim 1 wherein in step (b) the water wash after the caustic treatment is at a temperature below 25° C. to bare areas of the nonphotosensitive layer.

10. A process according to claim 1 wherein the colloidal silver is bleached with ferricyanide solution and fixed with thiosulfate solution.

11. A process according to claim 9 wherein the bared areas of the nonphotosensitive layer are bleached and fixed.

12. A process according to claim 9 wherein the layer (1) contains colloidal silver in gelatin.

* * * * *

UNITED STATES PATENT AND TRADEMARK OFFICE
CERTIFICATE OF CORRECTION

PATENT NO.  : 4,584,261
DATED       : April 22, 1986
INVENTOR(S) : Robert Paul Held It is certified that error appears in the above-identified patent and that said Letters Patent is hereby corrected as shown below:

| Column | Line | |
|--------|------|--|
| 10 | 62 | "was" should be --water-- |

Signed and Sealed this

Seventh Day of October, 1986

[SEAL]

*Attest:*

DONALD J. QUIGG

*Attesting Officer*  *Commissioner of Patents and Trademarks*